(12) United States Patent
Bogli

(10) Patent No.: US 6,385,547 B1
(45) Date of Patent: May 7, 2002

(54) AUTOMATIC MONITORING OF HIGH VOLTAGE SIGNALS

(75) Inventor: Craig D. Bogli, Avon, CT (US)

(73) Assignee: Otis Elevator Company, Farmington, CT (US)

( * ) Notice: Subject to any disclaimer, the term of this patent is extended or adjusted under 35 U.S.C. 154(b) by 0 days.

(21) Appl. No.: 09/401,380

(22) Filed: Sep. 22, 1999

(51) Int. Cl.$^7$ ................................................ G01R 19/00
(52) U.S. Cl. ........................... 702/64; 702/65; 324/600; 324/650; 324/713; 361/91.1
(58) Field of Search ............................... 702/64, 65, 71; 324/115, 99 D, 713, 600, 509, 133, 609, 684, 502, 551, 772, 650, 603, 611, 705, 700; 361/56, 119, 91.2, 91.7, 48, 42, 91.1

(56) References Cited

U.S. PATENT DOCUMENTS 5,373,410 A  * 12/1994 Schreiber et al. .............. 361/56
5,396,168 A  *  3/1995 Heep et al. ................... 324/115
5,909,348 A     6/1999 Zydek et al.

FOREIGN PATENT DOCUMENTS

DE         3408167 A1     3/1984     ........... G08B/23/00
EP         96307274.9    10/1995     ............. B66B/5/00
FR         2 732 171      3/1996     ....... H03K/19/0175

* cited by examiner

Primary Examiner—Marc S. Hoff
Assistant Examiner—Hien Vo

(57) ABSTRACT

A pair of terminals across a voltage to be monitored includes, in series, a resistor for developing a low voltage proportional to the high voltage to be monitored, a resistor to develop a voltage indicative of an over-current condition, and a resistance comprising a plurality of resistors which are connectable in parallel with one another, automatically, by remotely actuated switches. When the monitoring system is turned off, the resistances are all automatically set to maximum to minimize the loading on the elevator system. When the monitoring system is first turned on, a preconfiguration routine determines the correct resistance value as that which is the lowest resistance value for which an overcurrent condition does not occur, and this preconfiguration resistance value is stored for future use. Upon subsequent turn on of the monitoring system, all of the resistance values are set at the values determined during the preconfiguration routine. During normal monitoring, an overcurrent condition (that is an output from the sensor responding to the overcurrent resistor) will increase the series resistance by one increment, store the new setting for future use and provide an alarm message which may be used in any conventional fashion by maintenance personnel.

7 Claims, 3 Drawing Sheets

AUTOMATIC MONITORING OF HIGH VOLTAGE SIGNALS

TECHNICAL FIELD

This invention provides automatic selection of the correct total resistance for proper loading in a high voltage measurement circuit.

BACKGROUND ART

Robust monitoring of elevator signals require proper setting of voltage thresholds, as well as proper loading of unwanted noise. If the voltage threshold is set too low, invalid detection of coupled noise will result; if the voltage threshold is set too high, valid signal detection will be blocked. In addition, too little of loading will not squelch coupled noise, and too much loading will cause excessive power being drawn from the monitored signal (which could impact elevator operation). Previous digital input designs require an elevator installer to know ahead of time, or measure beforehand, the voltage of each signal, and then manually select the proper threshold and loading through wire jumpers as illustrated in FIG. 1. Therein, an opto-sensor 9 senses the voltage across a shunt resistor 10, the voltage being stepped down significantly by means of a series resistance 11 which is selected from a plurality of resistors 12–15 by means of wire jumpers 16–18. In other known measuring systems, the proper threshold and loading are established by selecting the proper input module to plug into a "back-plane" board. This manual approach leaves room for human error and takes a significant amount of time to measure and set.

DISCLOSURE OF INVENTION

Objects of the invention include sensing high voltage signals with proper thresholds and loading without the use of wire jumpers, back-plane boards, or other manual selection; reducing the risk of human error in the measurement of high voltage signals; eliminating human involvement in establishing proper threshold and loading for measuring high voltage signals; reducing the time required to install an elevator having a monitoring system; and providing a voltage monitoring system that automatically adjusts itself as conditions change.

According to the present invention, each sensor of a high voltage signal system is provided with an over-current detector to provide a signal indicative of the fact that the system is drawing too much current; proper threshold and loading is provided by automatically increasing the resistance in series with the signal sensing resistor to the point of eliminating the over-current condition. In accordance further with the invention, whenever the monitoring circuit is turned off, all of the sensors are set in their maximum resistance condition so as to minimize loading of the elevator circuitry. In still further accord with the invention, when the monitoring circuitry is first turned on, it is preconfigured with the help of elevator installation personnel, by causing each elevator circuit which is monitored to first assume an on state and then assume an off state, while at the same time the automatic monitoring system is monitoring overcurrent and establishing proper settings for each resistance, in turn. Thereafter, each time the monitoring system is turned on, having once been preconfigured, it will initialize each resistance at the resistance determined to be correct during preconfiguration, or determined by automatic adjustment, during operation. Then, as the elevator operates, the automatic monitoring system will respond to an overcurrent at any of the sensors to increase the resistance at that sensor, store the new setting, and optionally generate an alarm message.

The invention reduces risk of human error through mismeasurement or misplaced jumpers, and saves installation time by not requiring installation personnel to measure signals and place jumpers on a circuit board or modules in a back-plane board. The invention adjusts the measuring circuit automatically, over time.

Other objects, features and advantages of the present invention will become more apparent in the light of the following detailed description of exemplary embodiments thereof, as illustrated in the accompanying drawing.

BEST MODE FOR CARRYING OUT THE INVENTION

Figure 1:
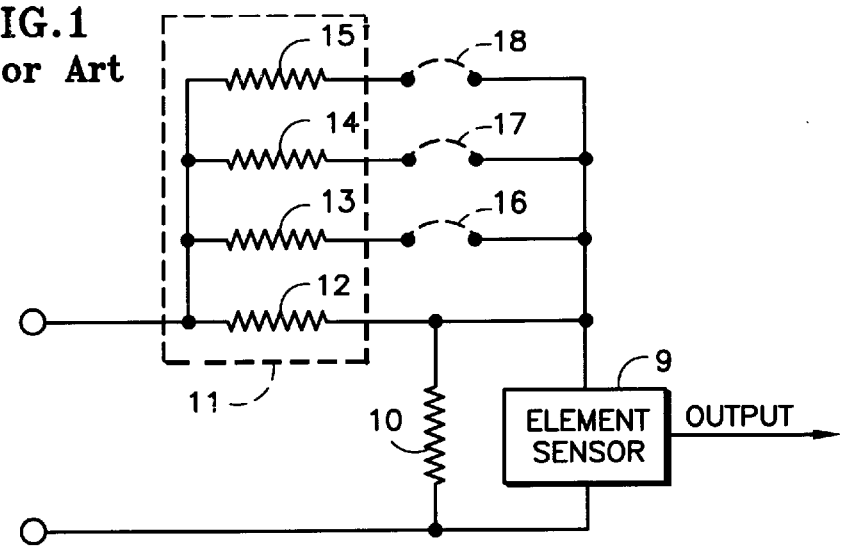
FIG. 1 is a simplified schematic block diagram of measurement circuitry known to the prior art.
Figure 2:
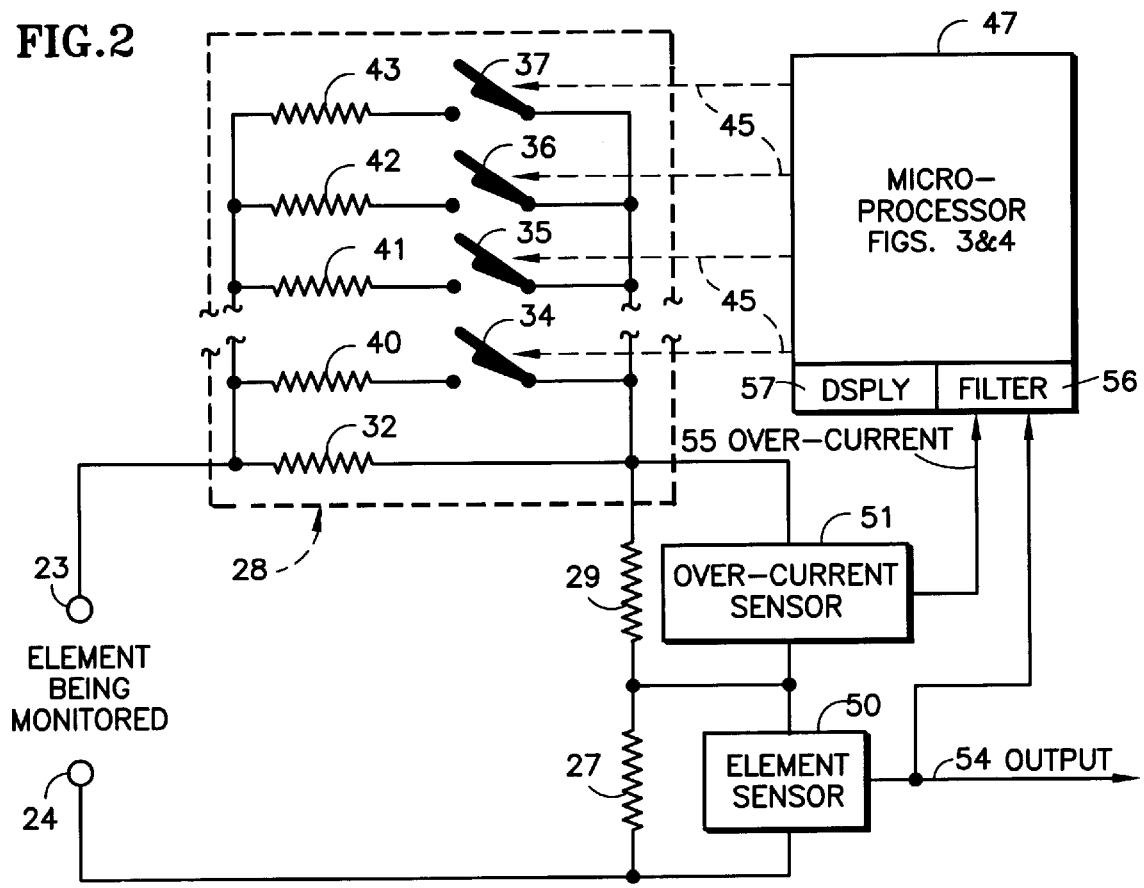
FIG. 2 is a simplified block diagram illustrating an automatic high voltage signal monitoring apparatus according to the present invention.

Referring to FIG. 2, for each element of the elevator system which is to be monitored, there are a pair of terminals 23, 24 connected to the element so that the voltage of the element can be sensed. Elements may, for instance, include relay coils and/or contacts, switch contacts, fan or other accessory voltages, and the like. The voltage being monitored may be either AC or DC, and may be high, being on the order of between 12 volts and 265 volts. This stepped down in a voltage divider comprising a sensing resistor 27 and a series resistance 28. In accordance with the invention, there is provided an overcurrent sensing resistor 29 in series with the resistors 27, 28. The resistance 28 is adjustable from a maximum resistance determined by a resistor 32 when each of a plurality of opto-switches 34–37 is open, to a minimum resistance determined by the parallel combination of the resistor 32 with a plurality of resistors 40–43 when all of the switches are closed. In this embodiment it is assumed that the resistance increases progressively from when all of the switches are closed to the switch 37 being opened, being the next higher resistance, and then with the switch 36 being open being the next higher resistance, and so forth. In accordance with the invention, the switches 34–37 are conventional FET optical couplers, such as Aromat NAIS brand, having control voltage selectively applied across the photo diodes to allow current conduction through the output terminals, thereby forming closed switches; without the control voltage, there is no conduction between the output terminals, thereby comprising open switches. The inputs to the opto-switches are connected by dual lines represented by the dotted lines 45 to a microprocessor 47 which selectively provides voltage to the respective opto-switches 34–37 to make them conductive, as described hereinafter. An element sensor 50 that responds to the voltage across the resistor 27 and an over-current sensor 51 that responds to voltage across the over-current resistor 29 each comprise an optocoupler, such as one in the NEC PS 2561 family, which couple any voltage in excess of a small threshold to corresponding outputs 54, 55. The resistor 27 is much larger than the resistor 29 so that the sensor 50 always provides an output when there is an expected input on the terminals 23, 24, but the sensor 51 provides an over-current-indicating output only when the voltage across terminals 23, 24 is large enough so as to require adjusting the resistance 28. To prevent false adjustments of the resistance 28, due to voltage spikes or other noise across terminals 23, 24, the microprocessor 47 may include a filtering function 56 to reduce unusual excursions on outputs 54, 55 and thereby avoid adjustments to the impedance 28. The microprocessor 53 may have a display 57, to indicate settings of the opto-switches in the impedance 28, and to prompt service personnel. The display 47 may inform installation personnel of the progress of the preconfiguration routine, and/or of the voltage across any particular element, as desired. The microprocessor 53 may be controlled in a manner including provision of the functions illustrated in FIGS. 3 and 4. The apparatus of FIG. 2 may be under the control of routines which are provided within an elevator car controller, or the like, instead of being under the control of the microprocessor 53.

Figure 3:
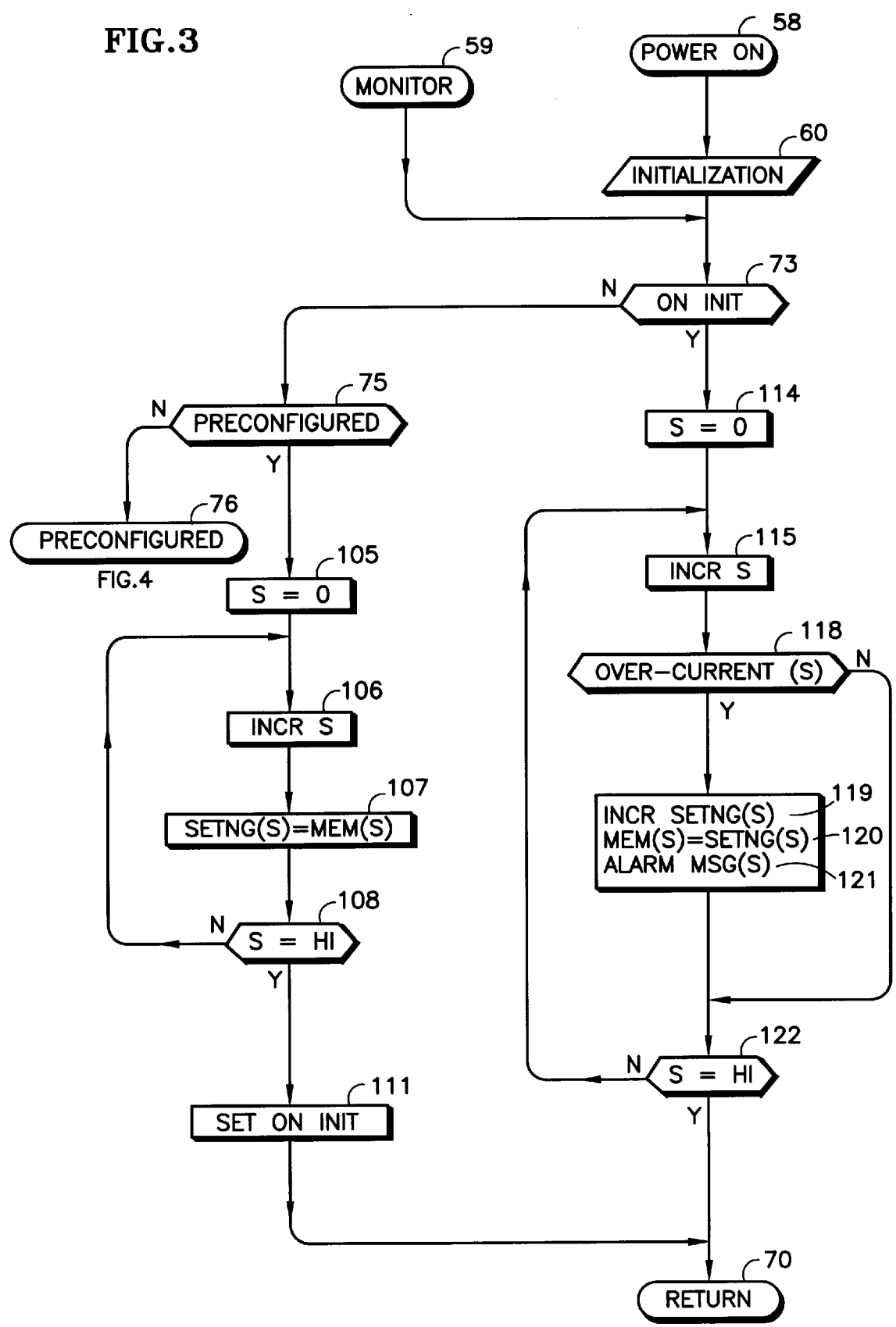
FIGS. 3 and 4 are flow diagrams of high level functions which may be performed in implementing the present invention.
Figure 4:
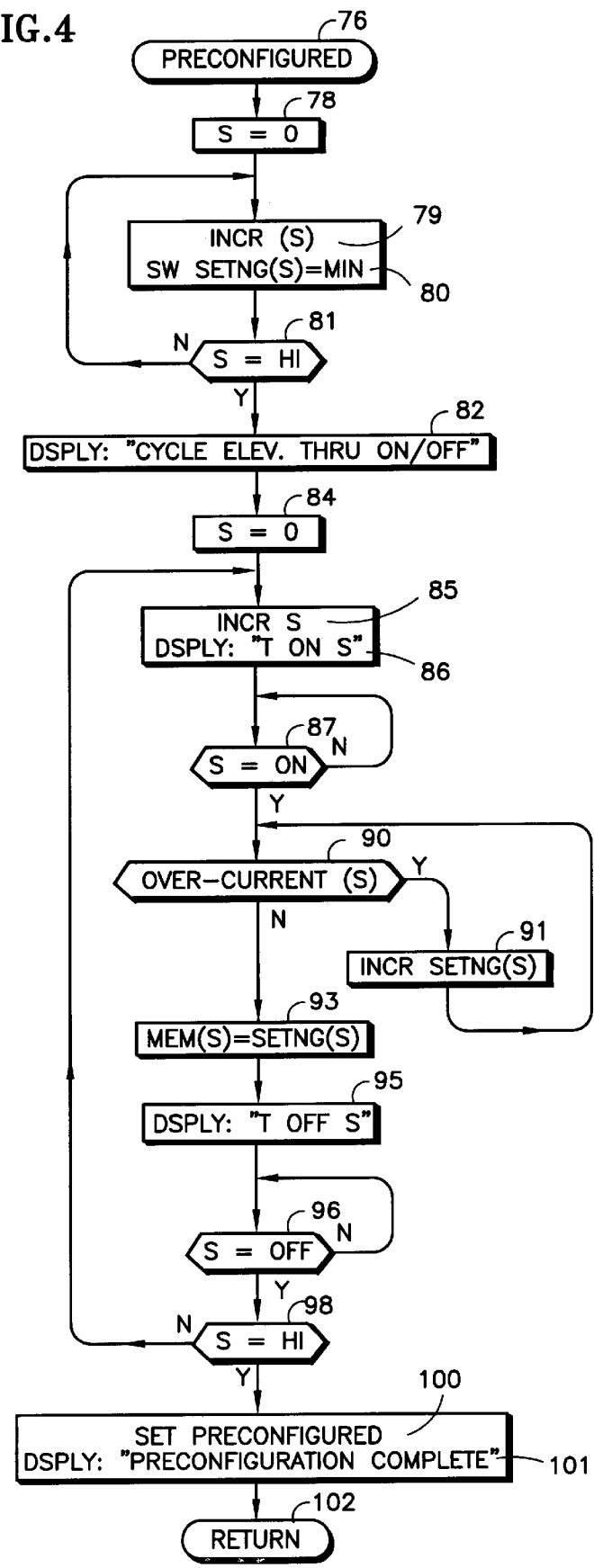

Referring to FIG. 3, a monitor program of the microprocessor 47 is reached upon power-up 58, or periodically through an entry point 59. The resistances are automatically maximized (that is, with all of the switches 34–37 for each of the elements in the system being open) whenever the device is off (no power), since there are no voltages on lines 45 (FIG. 2). After a conventional initialization subroutine 60, a test 73 determines if the "on" condition has been initialized or not. Initially it will not, so a negative result of test 73 reaches a test 75 to determine if the resistances have been preconfigured or not. During installation and after major servicing, preconfiguration will not initially have occurred, so a negative result of test 75 will reach the preconfigure routine of FIG. 4 through a transfer point 76. In FIG. 4, a first step 78 sets S equal to zero and then a step 79 increments S. A step 80 causes the switch setting for element S to be minimum (that is, closes all of the switches 34–37, FIG. 2). Then, a test 81 determines if all of the elements have had the resistances set to the minimum value, or not. If not, the program reverts to step 79 and causes the next element to have its switch setting set for minimum resistance. When all have been set for minimum resistance, an affirmative result of test 81 reaches a step 82 to display a cue to the installation personnel, that it is now time to cause elevator operation in such a fashion that every one of the elements will first be on and then be off. Then a step 84 sets S equal to zero, a step 85 increments S to point to the first element in the monitoring system, and a step 86 causes a cue to be displayed, such as "Turn on S", where S will be displayed as the number in sequence of the element currently to be turned on, that is to have voltage. Then a test 87 determines if S is turned on or not, which means that there is an output on the line 54 (FIG. 2) from the element numbered S. The programming will wait at test 87 until the installation personnel causes S to be turned on. Then a test 90 determines if an over-current condition is sensed on line 55 (FIG. 2) at element S. If so, the resistance setting for S is incremented at a step 91 and then the routine reverts to the test 90. The routine will cycle through test 90 and step 91 until there is no longer an over-current condition, which means that the correct resistance has been established for element S. Then a step 93 will set a memory location for element S equal to the setting of S established by incrementing in step 91. For this, the status of the switches 34–37 (FIG. 2) is read by the processor over the lines 45. This will be used whenever the monitor system is turned on, to establish the correct resistance for element S. Then a step 95 will display a cue to the installation personnel to turn off S, and a test 96 causes the program to hang up until S is turned off (that is, no more output on the line 54 for element S). A test 98 determines if S is set to the highest setting, meaning that the resistances have been set for all the elements; if not, a negative result of test 98 causes the routine to revert to step 85, incrementing S so that the next element in turn can have its resistance properly established as described. When all of the elements have been adjusted, an affirmative result of test 98 reaches a step 100 to set a preconfigured flag and a step 101 to display a cue to the installation personnel that preconfiguration is complete. Then other programming is reverted to through a return point 102.

In the next pass through the routine of FIG. 3, test 73 will still be negative but test 75 will now be affirmative, reaching a step 105 to set S equal to zero and a step 106 to increment S to point to the first element in the monitoring system. Then a step 107 causes the setting of S to be established as that which was stored in the memory for S within the preconfiguration routine at step 93. Then a test 108 determines if the resistance settings for all of the elements have been set or not. If not, the routine reverts to the step 106 to increment S and handle the next element in turn. When all the elements have had their resistance settings established, an affirmative result of test 108 reaches a step 111 to set the on initialized flag. And then other programming is reached the return point 70.

In the next pass through the routine of FIG. 3, test 73 is now affirmative, meaning that the monitoring system is now going to enter into a normal monitoring operation. An affirmative result of test 73 reaches a step 114 to set S equal to zero and a step 115 increments S to point to the first element in the monitoring system. Then a test 118 determines if element S has an over-current, or not. If it does, the setting for S is incremented at step 119, causing the resistance to increase (that is, an additional one of the switches 34–37 is opened), a step 120 stores the new setting in the memory for element S, and a step 121 causes an alarm message for element S to be generated. This message may be sent by any conventional or other means to someplace where maintenance personnel may take cognizance of it, and/or it may be recorded and/or processed in an elevator monitoring and/or maintenance routine. On the other hand, if an over-current is not sensed at element S, the steps 119–121 are bypassed. A test 122 determines if all of the elements have had their over-currents tested; if not, the program reverts to step 115 to increment S to test for overcurrent at the next element in the system. When all of the elements have been tested for overcurrents, an affirmative result of test 122 causes other programming to be reverted to through the return point 70.

The steps 119–121 thus not only alert maintenance personnel to the fact that the voltage being monitored has increased by some threshold amount, but also adjust the resistance of the monitoring circuitry so as to make it correct for the newly established voltage condition, and record it for use thereafter. The overcurrent sensor of the invention thus provides for establishing the correct initial resistance during the preconfiguration process, but also provides automatic alarm and readjustment during normal monitoring. The alarm message may be utilized more or less as an alert, to be taken into account during subsequent diagnostic processes or to indicate that a future problem requiring corrective action may soon occur.

When the power is turned on, over time, after configuration, the path in FIG. 3 is through a negative result of test 73 and an affirmative result of test 75 to reach the "on" initiation steps and tests 105–111; then, every so often while the monitor apparatus remains on, the routine of FIG. 3 is reached through the monitor entry point 59, and an affirmative result of test 73 reaches the overcurrent functions 114–122. Monitoring of the output 54 to determine the condition of the element being monitored may be accomplished in any suitable conventional way, and forms no part of the invention. If other than opto-switches are used, for which the configuration cannot be read, the increments of step 106 may be counted for each switch and the count may be stored during preconfiguration.

Thus, although the invention has been shown and described with respect to exemplary embodiments thereof, it should be understood by those skilled in the art that the foregoing and various other chances, omissions and additions may be made therein and thereto, without departing from the spirit and scope of the invention.

I claim:

1. A high voltage monitoring system for monitoring the voltage across a plurality of elements, comprising:

a plurality of pairs of contacts, each connected across a corresponding element, the voltage of which is to be monitored;

a resistive series circuit connected between each pair of said terminals, each of said circuits including a sensing resistor, an over-current resistor and a variable resistance, said variable resistance including a group of remotely-actuable switches, and a plurality of other resistors, each said other resistors being connectable into said resistive series circuit, in parallel with any of said other resistors which are connected into said resistive series circuit, by means of a corresponding one of said remotely-actuable switches; and signal processing means operable when said monitoring system is turned on for monitoring the voltage across said over-current resistor and for opening a selected one of said switches in response to detecting a voltage indicative of an over-current condition, thereby to increase said variable resistance to the point of eliminating said over-current condition, wherein said signal processing means comprises means operative, when said monitoring system is initially installed to monitor said elements, for determining a preconfiguration resistance value for each of said variable resistances which is the minimum resistance for which no related over-current condition is detected, and for storing, for each of said elements, the on/off configuration of the related group of switches corresponding to the related one of said preconfiguration resistance values and wherein said signal processing means comprises means operative each time said that monitoring system is turned on after said switch configurations have been stored, to set the on/off configuration of each of said group of switches to the stored on/off configuration.

2. A system according to claim 1 wherein said means for monitoring provides a related alarm message in response to detecting said over-current condition in one of said circuits.

3. A system according to claim 1 wherein:

when said monitoring system is turned off, all of said switches are open, thereby to maximize the resistance of all of said circuits and provide minimum loading of the voltage across each element.

4. A system according to claim 1 wherein:

said switches are opto-switches, the on/off status of which can be monitored remotely, and said status of each switch is stored in said on/off configuration.

5. A method of monitoring a voltage, comprising:

providing a series combination of a sensing resistor in series with a variable resistance, said series combination being connected in parallel with said voltage to be monitored, said variable resistance comprising electrically actuable switches;

monitoring the current in said series combination and opening one of said switches, so as to increase the resistance of said variable resistance, in response to sensing a current indicative of an over-current condition in said series combination;

initializing said variable resistance to a minimum resistance upon initial startup and increasing said resistance of said variable resistance to a preconfiguration resistance for which no related over-current condition is detected;

storing a value of said preconfiguration resistance; and setting said variable resistor to said value upon startup following initialization.

6. A method according to claim 5, comprising:

providing an alarm message in response to sensing an over-current condition in said series combination.

7. The method of monitoring a voltage of claim 5 further comprising the steps of:

monitoring the current in said series combination upon startup following initialization and modifying said variable resistance to prevent any detected over-current condition;

storing a modified value of the modified variable resistance; and setting said variable resistance to said modified value upon a subsequent startup.

* * * * *